United States Patent
Murphy et al.

(10) Patent No.: US 10,204,732 B2
(45) Date of Patent: Feb. 12, 2019

(54) DIELECTRIC STACK, AN ISOLATOR DEVICE AND METHOD OF FORMING AN ISOLATOR DEVICE

(71) Applicant: Analog Devices Global, Hamilton (BM)

(72) Inventors: Patrick J. Murphy, Patrickswell (IE); Stephen O'Brien, Clarina (IE); Sarah Carroll, Limerick (IE); Bernard P. Stenson, Limerick (IE); Conor John Mcloughlin, Ballina (IE); Michal J. Osiak, Castletroy (IE)

(73) Assignee: Analog Devices Global, Hamilton (BM)

( * ) Notice: Subject to any disclaimer, the term of this patent is extended or adjusted under 35 U.S.C. 154(b) by 78 days.

(21) Appl. No.: 15/179,741

(22) Filed: Jun. 10, 2016

(65) Prior Publication Data

US 2017/0117084 A1    Apr. 27, 2017

Related U.S. Application Data

(63) Continuation-in-part of application No. 14/922,037, filed on Oct. 23, 2015, now Pat. No. 9,941,565.

(51) Int. Cl.
*H01F 5/00*         (2006.01)
*H01F 27/28*        (2006.01)
(Continued)

(52) U.S. Cl.
CPC ........... *H01F 27/2804* (2013.01); *H01B 3/12* (2013.01); *H01B 3/306* (2013.01); *H01B 17/62* (2013.01);
(Continued)

(58) Field of Classification Search
CPC ................. H01F 5/00; H01F 27/00–27/36
(Continued)

(56) References Cited

U.S. PATENT DOCUMENTS 6,614,643 B1    9/2003   Morita
6,927,662 B2    8/2005   Kahlmann et al.
(Continued)

FOREIGN PATENT DOCUMENTS

DE    10 2005 025083 A1    12/2006
EP        1 156 525 A1     11/2001
(Continued)

OTHER PUBLICATIONS

Extended European Search Report dated Jan. 20, 2017 for Application No. EP 16193510.1.
(Continued)

*Primary Examiner* — Tuyen Nguyen
(74) *Attorney, Agent, or Firm* — Wolf, Greenfield & Sacks, P.C.

(57) ABSTRACT

An isolator device is provided comprising a body of first dielectric material between the first and second conductors, such as primary and secondary coils of a micro-transformer. A region of second dielectric material is provided between the body of first dielectric material and at least one of the first and second electrodes, wherein the second dielectric material has a higher relative permittivity than the first dielectric material. This provides enhances ability to withstand the Electric fields generated at the edge of a conductor. The body of the first dielectric can be tapered to provide stress relief to prevent the second dielectric material developing stress cracks.

18 Claims, 8 Drawing Sheets

(51) Int. Cl.
*H01L 33/44* (2010.01)
*H01L 33/62* (2010.01)
*H01B 3/12* (2006.01)
*H01B 3/30* (2006.01)
*H01B 17/62* (2006.01)
*H01B 19/04* (2006.01)
*H01F 41/04* (2006.01)

(52) U.S. Cl.
CPC ............... *H01B 19/04* (2013.01); *H01F 5/00* (2013.01); *H01F 41/041* (2013.01); *H01L 33/44* (2013.01); *H01L 33/62* (2013.01)

(58) Field of Classification Search
USPC ............ 336/65, 200, 232, 206–208; 257/531
See application file for complete search history.

(56) References Cited

U.S. PATENT DOCUMENTS

| | | | |
|---|---|---|---|
| 7,489,526 B2 | 2/2009 | Chen et al. | |
| 7,947,600 B2 | 5/2011 | Iwaya et al. | |
| 8,237,534 B2 | 8/2012 | Fouquet et al. | |
| 8,364,195 B2 | 1/2013 | Spina et al. | |
| 8,378,776 B1 | 2/2013 | Gabrys et al. | |
| 8,427,844 B2 | 4/2013 | Ho et al. | |
| 8,446,243 B2 | 5/2013 | Strzalkowski et al. | |
| 8,519,506 B2 | 8/2013 | Hopper | |
| 9,105,391 B2 | 8/2015 | Fouquet et al. | |
| 9,142,502 B2 * | 9/2015 | Gong | H01L 23/49822 |
| 9,704,843 B2 * | 7/2017 | Kilger | H01L 25/50 |
| 9,929,038 B2 | 3/2018 | O'Sullivan | |
| 9,941,565 B2 | 4/2018 | McLoughlin et al. | |
| 2001/0011761 A1 | 8/2001 | Imoto | |
| 2002/0052106 A1 | 5/2002 | Ikura | |
| 2004/0026776 A1 | 2/2004 | Brand | |
| 2004/0056749 A1 | 3/2004 | Kahlmann | |
| 2005/0026351 A1 | 2/2005 | Farrar | |
| 2006/0071309 A1 | 4/2006 | Kato | |
| 2006/0075836 A1 | 4/2006 | Zribi | |
| 2006/0077028 A1 | 4/2006 | Huang | |
| 2007/0121249 A1 | 5/2007 | Parker | |
| 2008/0030080 A1 | 2/2008 | Chen et al. | |
| 2008/0061631 A1 | 3/2008 | Fouquet | |
| 2008/0179963 A1 | 7/2008 | Fouquet | |
| 2008/0311862 A1 | 12/2008 | Spina et al. | |
| 2009/0098735 A1 | 4/2009 | Cho | |
| 2009/0104769 A1 | 4/2009 | Lee | |
| 2009/0160011 A1 | 6/2009 | Park | |
| 2009/0280314 A1 | 11/2009 | Mahler et al. | |
| 2009/0280646 A1 | 11/2009 | Iwaya et al. | |
| 2011/0095392 A1 | 4/2011 | Wahl et al. | |
| 2012/0168901 A1 | 7/2012 | Santangelo et al. | |
| 2012/0181874 A1 | 7/2012 | Willkofer et al. | |
| 2014/0151856 A1 | 6/2014 | Otremba et al. | |
| 2014/0151889 A1 | 6/2014 | Plekhanov et al. | |
| 2014/0175602 A1 | 6/2014 | Funaya et al. | |
| 2014/0252533 A1 | 9/2014 | O'Sullivan | |
| 2015/0357113 A1 | 12/2015 | Scholz | |
| 2017/0117602 A1 | 4/2017 | McLoughlin et al. | |

FOREIGN PATENT DOCUMENTS

| | | |
|---|---|---|
| EP | 2 348 572 A1 | 7/2011 |
| GB | 2 132 817 A | 7/1984 |

OTHER PUBLICATIONS

Extended European Search Report dated Jun. 12, 2014 for European Application No. 14156529.1.
European Examination Report dated Mar. 16, 2017 for European Application No. 14156529.1.
[No Author Listed], iCoupler® Technology: An Alternative to Optocouplers. Analog Devices, Inc. Published Jan. 24, 2011. http://www.youtube.com/watch?v=sHtl2p03RSO.
[No Author Listed], Digital Isolators. Analog Devices. Retrieved Jun. 25, 2013 from http://www.analog.com/en/interface-isolation/digital-isolators/products/index.html. 8 pages.

* cited by examiner

DIELECTRIC STACK, AN ISOLATOR DEVICE AND METHOD OF FORMING AN ISOLATOR DEVICE

CROSS REFERENCE TO RELATED APPLICATIONS

The present application is a continuation-in-part (CIP) claiming the benefit under 35 U.S.C. § 120 of U.S. patent application Ser. No. 14/922,037, filed Oct. 23, 2015 and entitled "Isolator and Method of Forming an Isolator," which is hereby incorporated herein by reference in its entirety.

TECHNICAL FIELD

This disclosure relates to improvements in dielectric layers as used, for example, in isolator devices. This disclosure also relates to methods of manufacturing isolator devices.

BACKGROUND

Most electronic circuits are now implemented within microelectronic circuits, commonly referred to as integrated circuits or "chips". Such a chip comprises a semiconductor die carrying the microelectronic circuit encapsulated within a plastics or ceramic case. This enables the chip to be bonded or soldered to circuit boards and the like for the formation into more complex products. Many applications of microelectronic circuitry may require communication of signals between a relatively low voltage domain, where for example the supply rails may differ from each other by only a few volts, and a higher voltage domain containing higher voltage components as might be found in the energy, signaling, automation, communications or motor control arenas. This list is not exhaustive. There are also safety critical applications such as medical applications, where high voltages must not be allowed to propagate from the circuit towards a patient being monitored. Although these high voltages may not be generated deliberately, they might occur in certain fault modes, for example if a power supply were to develop a fault, or if a lightning strike were to induce overvoltage transients into power supply or data connections to the device.

It is known to isolate the low voltage domain and the high voltage domain of a circuit or system from one-another using "isolators". These have typically involved discrete components, such a signal transformers, being mounted on a circuit board between a low voltage side of the board and the high voltage side of the board. More recently "chip scale" isolators have become available. Within a "chip scale" isolator components that communicate between the low voltage and high voltage sides or domains of the circuit are provided within a package of the type known in the provision of integrated circuits, such as a dual in line package. Such a package may contain two or three dies which are co-packaged such that the device still presents itself to a user as an integrated circuit.

The reduced dimensions in chip scale isolators start to give rise to breakdown mechanisms not seen in non-chip scale isolators, i.e. discrete component isolators. Isolators are often given a rating called the breakdown voltage. When the voltage difference between the low and high voltage parts of the isolator exceeds the breakdown voltage, the dielectric material between the parts may exhibit electrical breakdown and become electrically conductive, no longer performing as an effective insulator. To increase the breakdown voltage, an isolator can be manufactured with a thicker layer of dielectric material between the electrodes.

SUMMARY

According to a first aspect of this disclosure there is provided a dielectric structure, comprising a first layer of a first type of dielectric formed adjacent a substrate, and a second layer of the first dielectric formed on the first layer, wherein the second layer is delimited by a periphery and at least some parts of the second layer do not extend to or beyond a periphery of the first layer. A layer of a second dielectric material is formed over an uppermost layer of the first dielectric material.

In a second aspect of this disclosure there is provided an electronic device including the isolator device of the first aspect.

It is thus possible to provide an isolator device comprising first and second conductive structures; a body of first dielectric material between the first and second conductive structures; and at least one region of second dielectric material between the first dielectric material and at least one of the first and second conductive structures, wherein the second dielectric material has a higher relative permittivity than the first material, and wherein the body of first dielectric is formed so as to have a tapered form or step-wise approximation to a tapered form.

According to a third aspect there is provided a method of forming an isolator device, comprising, forming a first conductor over a first region of a substrate, forming a body of first dielectric material over the first region, and forming a second conductor over the first layer. The body of the first dielectric is formed by the deposition of at least two layers of the first dielectric with the second layer being arranged such that at least a portion of the first layer remains exposed. The method further comprises forming at least one region of second dielectric material between the first conductor and the layer of first dielectric material, and/or between the layer of first dielectric material and the second electrode.

Accordingly, the method further comprises at least one of:
(i) forming a region of a second dielectric material over at least part of the first conductor before the forming of the layer of first dielectric material;
(ii) forming a region of a second dielectric material over the layer of first dielectric material and before the forming of the second electrode;
where the second dielectric material has a higher relative permittivity than the first material.

In a further aspect of this disclosure there is provided a component comprising first and second conductive elements on either side of a dielectric stack comprising two different dielectric materials, and where the stack includes stress relief structures so as to avoid stress related damage to the component.

BRIEF DESCRIPTION OF THE FIGURES

Embodiments will now be described by way of non-limiting example only with reference to the accompanying Figures, in which.

DETAILED DESCRIPTION OF SOME EMBODIMENTS

Figure 1:
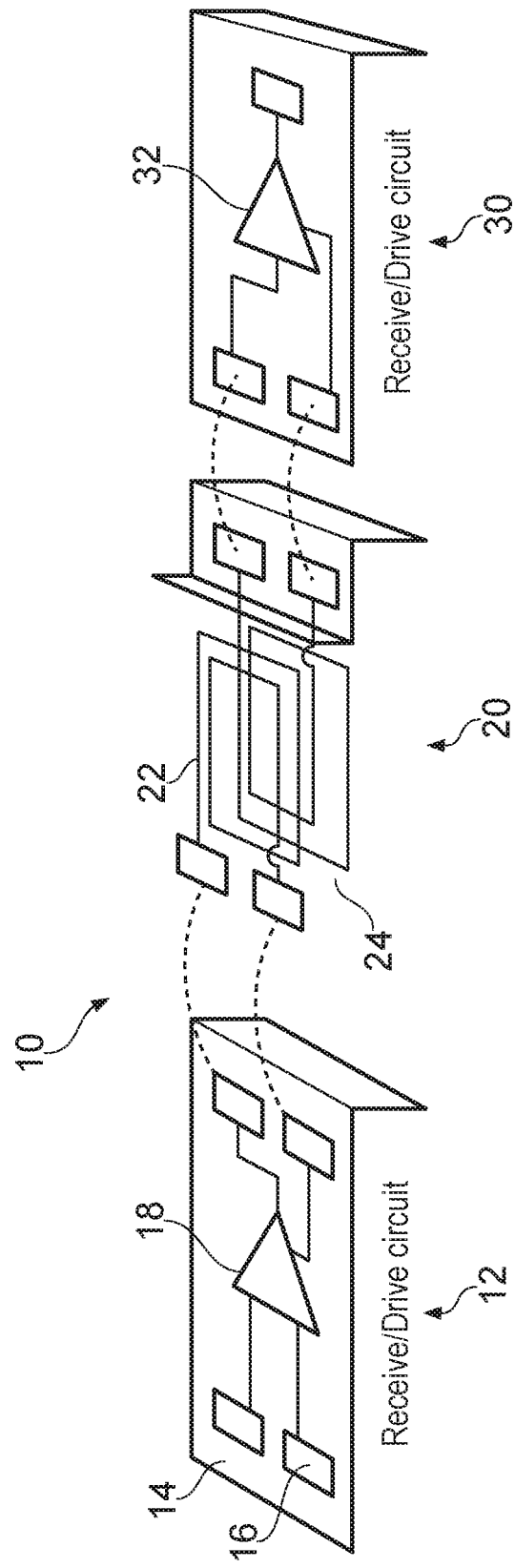
FIG. 1 shows an example of a signal transmission device.

FIG. 1 schematically represents the components within an example signal isolator system 10 which acts to receive an input signal at the first voltage or a first voltage range, which may be a relatively high voltage, and to convey it at a lower voltage for processing by further components, not shown, such as a microprocessor. The different voltage ranges can be regarded as being different voltage domains. Such an isolator system 10 comprises a receive circuit 12 that has input terminals 14 and 16 for receiving an input signal, and processing electronics 18 which acts to convert the signal into a form suitable for transmission across an isolation component 20. The processing electronics 18 may, for example, encode a voltage by converting it to the frequency domain, or may encode a logic signal by providing a high frequency sinusoid to the isolation component when the logic signal is asserted, and inhibiting provision of the sinusoid to the isolation component when the logic signal is not asserted or may encode it as distinguishable pulses. The isolation component 20 in this example is a micro-transformer comprising a first transformer coil 22 and a second transformer coil 24. The coils are separated by an insulating material. An output of the coil 22 is provided to an output circuit 30 where a further electronic circuit 32 processes the signals received from the second coil 24 in order to reconstitute a representation of the input signal provided to the drive circuit 12. The arrangement shown in FIG. 1 is highly simplified, and, for example, a single channel may include two transformers such that the signal can be conveyed in a differential manner, or in a phase or frequency modulated manner. Additionally, it may be desirable to send signals back from the low voltage side of the circuit 30 to the higher voltage side 12, and therefore each element may be provided in a bi-directional manner, and the isolator may be used to convey signals in a bi-directional manner, or additional isolators may be provided such that some of the isolators may be dedicated for transmission of data in one direction and other of the isolators may be dedicated for the transmission of data in a second direction. Furthermore, if the input receiver circuitry 12 is unable to derive power from the equipment that it is connected to, then it is also possible to use the transformers (or at least some other micro-transformers) to provide power to run the receiver circuit.

As shown in FIG. 1, the receiver circuit 12, the isolator 20, and the output circuit 30 have been provided on respective substrates. All the substrates are packaged in the same chip-scale or integrated circuit package. In the example shown, the receivers at the high voltage side 12 and at the low voltage output side circuit 30 are provided on respective substrates (e.g. different semiconductor dies), but either of those substrates may optionally incorporate the isolator 20. Although shown as an example with inductively coupled transformer coils, embodiments described herein may alternatively be applied to other technologies such as capacitively coupled isolators which use plate electrodes instead of coils.

Figure 2:
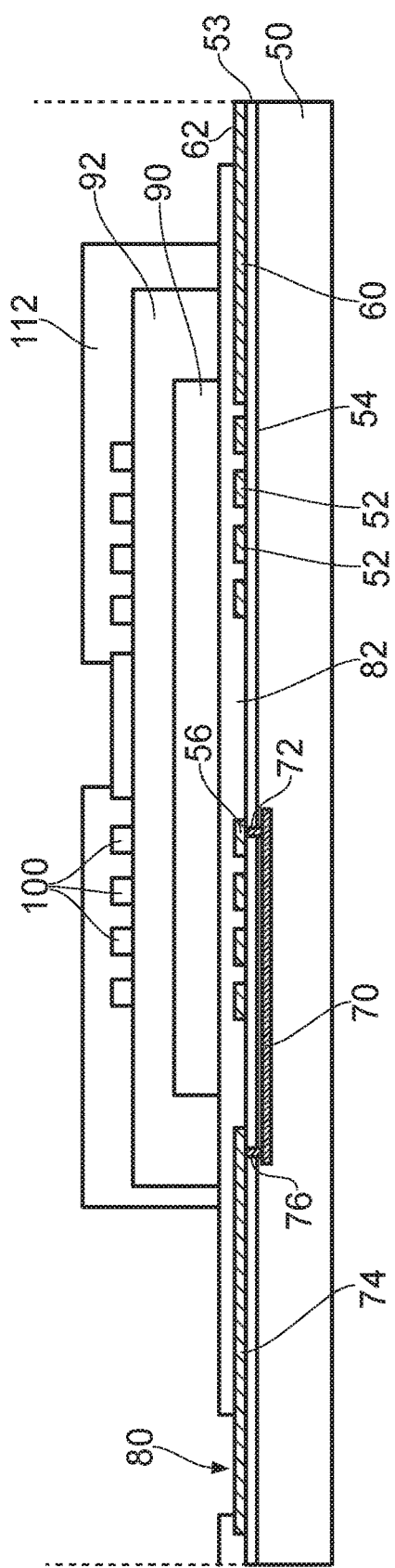
FIG. 2 shows an example of a micro-transformer isolator device.

FIG. 2 is a cross section through an embodiment of an isolator 20. The diagram is not to scale, and in particular the thickness of the substrate 50 may be greater than shown in FIG. 2. In the arrangement shown in FIG. 2 a substrate 50, such as a semiconductor wafer, acts as a carrier for the insulating structure used to form the transformer based signal isolator. Other materials such as glass may also be used as a substrate. A first conductive structure comprising a first coil 52 formed as a spiraling metal track is provided over the surface of the substrate 50. A layer of insulator 53 such as silicon dioxide insulates the metal track from the substrate 50. The metal track may be formed of Aluminum, Gold or any other suitable metal. Other conducting materials may also be used. The nature of a spiral track is that a connection is made to a radially outermost most part 54 of the spiral 52 and that a connection must also be made to radially innermost part 56 of the spiral 52. The connection to the outermost part 54 can be easily accomplished by extending the metal layer used to form the spiral such that it forms a track 60 extending towards a bond pad region 62. A connection to the innermost portion 56 of the spiral may be made in any suitable fashion but in this example is made in a plane above or below the plane of the spiral. In the arrangement shown in FIG. 2 an interconnection 70 is provided below the plane of the spiral conductor 52, for example by forming a highly doped region or a further metal layer 70 which connects to the innermost part 56 by way of a first via 72 and which connects to a further section of metal track 74 by way of a further via 76. Thus a further insulation oxide layer (not shown) may lie beneath the metal layer 70 so as to insulate it from the substrate. The further section of metal track 74 extends towards a bond pad region 80. The metal tracks may be covered by a thin layer of passivation 82, such as silicon dioxide, or some other insulator, except in the regions of the bond pads 62 and 80 where the passivation is etched away. The fabrication of such structures is known to the person skilled in the art and need not be described further here.

The manner in which connections are made to the electrode 52 or any other electrode is shown merely as an example, and other connection techniques may be used.

It is known to the person skilled in the art that insulators can typically withstand the maximum electric field across them before dielectric breakdown occurs and a conductive path opens through the insulator layer(s) between the electrodes. The electric field is expressed in volts per unit distance, and hence typically higher breakdown voltages may be achieved through increased thickness of the insulator. However, the local electric field in some regions, particularly regions proximate to the conductive structures, i.e the transformer windings, may still pose a breakdown risk even with increased insulator thickness, leading to breakdown of the device. It is known that E-field strength increases with decreasing radius of curvature. The edges of the tracks forming the windings represent a region of decreased radius of curvature compared to the nominally planar bottom surface of the track. In order to reduce the electric field strength adjacent the conductive structure, such as at an edge of a coil, a material for the insulator may be chosen that has a higher relative permittivity εr, despite the fact that such materials generally have a lower breakdown voltage.

Just as a reminder of the general principle, if a sphere of radius R was charged with a value of Q coulombs, the E field at radius R can be expressed as $$E = Q/4\pi\varepsilon R^2$$

This shows the general principle that increasing ε reduces the Field strength E and that reducing R increases E.

Polyimide is a compound which is suitable for use as an insulator as it has a breakdown voltage of around 800 to 900 volts per μm. Polyimide is also relatively easy to work with within the context of semiconductor fabrication processes and is largely self planarising and is photo-definable. The polyimide is generally deposited as a film and a positive photoresist is applied over the film and imaged to define a desired pattern in the underlying polyimide film. The photoresist is then developed. The developer acts to wet etch the unmasked regions of the polyimide. After the completion of developing step the polyimide is typically rinsed and then cured at temperature into an aromatic polyimide film. Other insulating materials that are commonly used in integrated circuit fabrication include BCB and SUB. Other insulating polymers and oxides may also be used.

As shown in FIG. 2, a first layer of insulator 90, for example of polyimide, is deposited over the region of the substrate 50 and the passivation 82 beneath which the first coil 52 is formed. After patterning, etching and curing a second overlapping layer 92 of insulator, such as polyimide is formed over the first region 90 so as to build up an additional thickness of the insulator. The ends of the region 92 may be allowed to wrap around the ends of the region 90, such that the insulating structure increases in both depth and lateral extent. Each deposition step may increase the thickness of the insulator by, in the case of polyimide, between 10 to 16 microns for example. Thus after two deposition steps the insulator layers 90 and 92 may together be between 20 and 32 microns thick. If necessary or desirable further layers can be deposited to form thicker structures. Next a second metallic layer 100 is deposited over the layer 92 and patterned, for example to form a second spiral track which co-operates with the first spiral track to form a transformer. The second metal layer 100 may be of aluminum or another suitable metal such as gold. As with the first conductive spiral track, connections may be made to both an innermost portion of the spiral and an edge portion. For diagrammatic simplicity the connection to the outer edge portion has been omitted, whereas the central portion may be connected to a bond pad region 110.

Following formation of the second spiral conductive track 100, a third layer 112 of insulator, such as polyimide, is deposited over the second layer 92 and over the spiral track 100. The layer 112 may extend beyond and overlap the second layer 92. After formation of the layer 112 it is masked and then selectively etched so as to open up a connection aperture 113 to the bond pad 110. The inventors realized that this structure could be improved upon.

Figure 3:
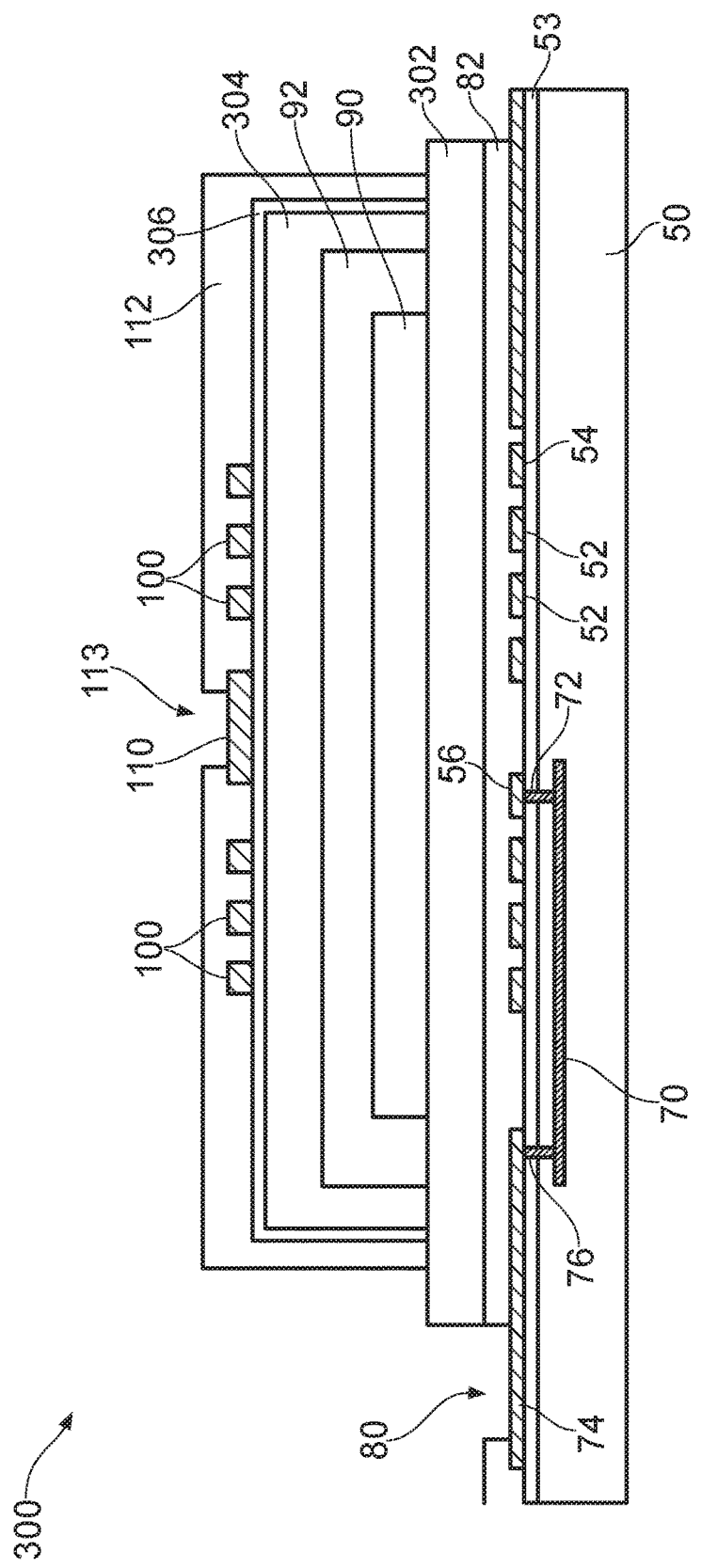
FIG. 3 shows another example of an isolator device.

FIG. 3 shows an example embodiment of an isolator device 300. The isolator device includes some features similar to those shown in FIG. 2 and described above, and these features are given like reference numerals in FIGS. 2 and 3. These features are not described further herein.

The isolator device 300 differs from that shown in FIG. 2 through the inclusion of one, or as shown two, additional layers 302, 304 of dielectric material and optionally an additional passivation layer 306.

A first layer of second dielectric material 302 is formed over the first passivation layer 82 and underneath the first layer 90 of the first dielectric material (e.g. polyimide). The second dielectric material has a higher relative permittivity (dielectric constant) than the layers 90 and 92 of polyimide or other dielectric material. Examples of the second dielectric material include silicon nitride (SiN), sapphire (Al2O3), tantalum pentoxide (Ta2O5), strontium titanate (SrTiO3), bismuth ferrite (BiFeO3), silicon dioxide and barium strontium titinate (BST). This is however not an exhaustive list and other materials may be used. Additionally or alternatively, different layers of high relative permittivity material could use different materials.

Thus the first layer 302 of second dielectric material may be formed after the passivation layer 82 (and after the first electrode 52) and before the insulating layer or layers of first dielectric material. The process of forming the first layer 302 may be combined with the process of forming other layers in some cases. For example, to form an opening to expose the bond pad region 80, the passivation layer 82 and first layer 302 of second dielectric material may be masked and etched simultaneously, though this can alternatively be done separately for each layer.

A second layer 304 of the second dielectric material is located over the layer or layers of first dielectric material 90 and 92. The second layer 304 may be of the same material as the first layer 302, or may be of a different material, though both layers 302 and 304 have a higher relative permittivity than the material used to form the layers 90 and 92. In the example shown, the edges of the layer 304 are allowed to wrap around the edges of the layers 90 and 92. As such, the layers 90 and 92 are encapsulated within the layers 302 and 304 of material of higher relative permittivity.

An additional passivation layer 306 is optionally provided over the layer 304 and is allowed to wrap around the edges of the layer 304. The second conductive structure, which in this example is a coil 100 is then formed over the additional passivation layer 306, and includes suitable connections. For example, a bond pad 110 is provided for an electrical connection to an inner part of the coil 100, and another connection (not shown) can also be made to an outer part of the coil 100.

Figure 4:
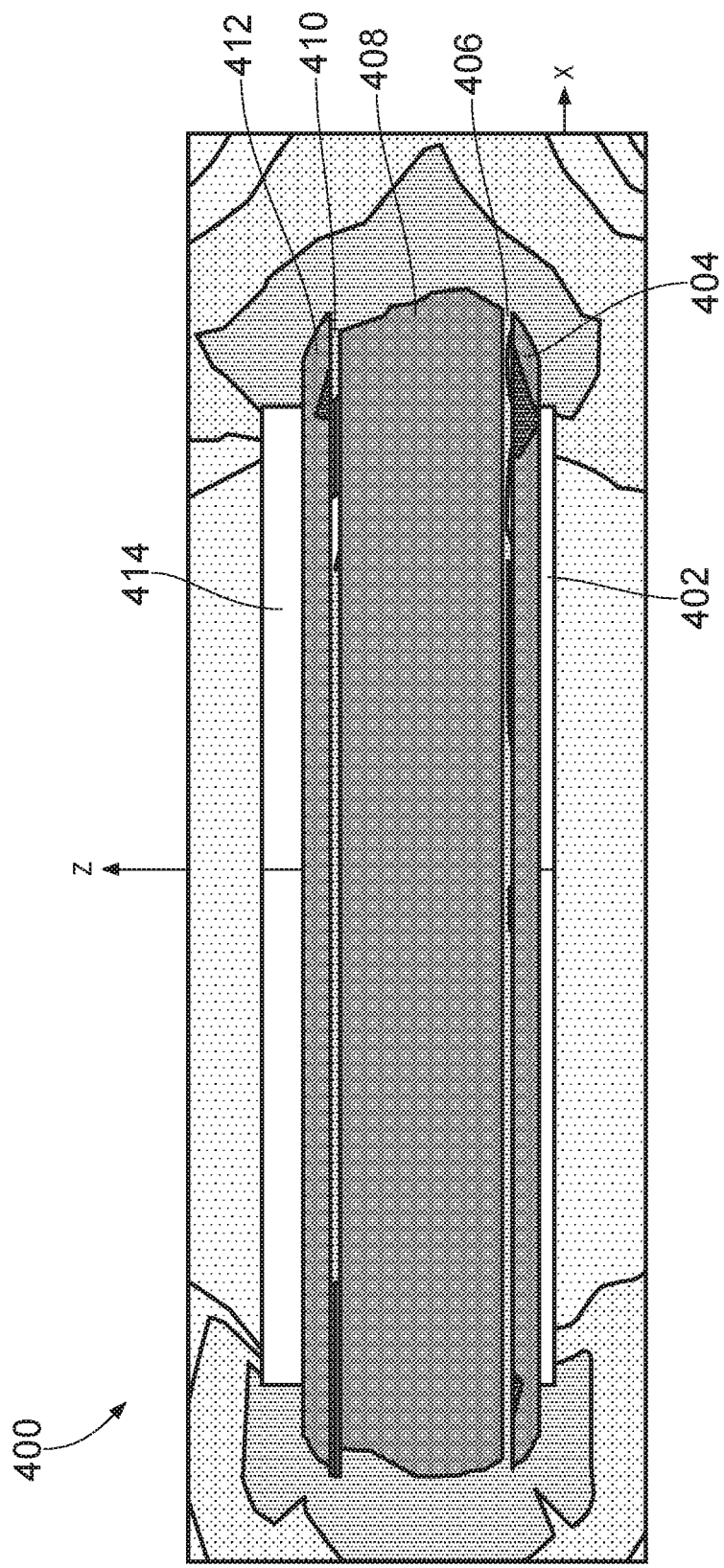
FIG. 4 shows a simulation of electrical field within an example isolator device.

FIG. 4 shows a simulation of an electric field within a cross section of an isolator device 400 according to an embodiment of the disclosure. A darker region indicates a stronger electric field. The isolator device 400 includes a first electrode 402, a first passivation layer 404, a first dielectric layer 406, one or more second dielectric layers 408, a third dielectric layer 410, a second passivation layer 412 and a second electrode 414. The layer or layers 408 have a lower relative permittivity than the layers 406 and 408. The layers 406 and 408 may be formed from the same material as each other, and thus may have the same relative permittivity, though in some embodiments the layers 406 and 408 may be made from different dielectric materials. Thus they may have the same or different relative permittivity, though still higher than the layer 408.

The layers 404-412 are shown as having a symmetric arrangement between the electrodes 402 and 414, and example thicknesses of the layers are as follows: the first passivation layer 404 of between around 0.1 and 5 microns, such as 3 microns thickness; the first dielectric layer 406 of 1 micron; the one or more second dielectric layers 408 of between around 10 and 80 microns, such as 20 microns in total; the third dielectric layer 410 of 1 micron; and the second passivation layer 412 of between around 0.1 and 5 microns, such as 3 microns. However, in alternative embodiments, the layers may have other thicknesses, and/or may also show a non-symmetric arrangement between the electrodes 402 and 414. For example, one of the layers 406, 410 may be omitted.

In the example of FIG. 4, the simulation is shown whereby a high voltage is applied across the two electrodes 402 and 414. It can be seen that the darkest regions, and thus the regions within the device with the strongest electric field, are near to the electrodes, and in particular near the edges of the electrodes. It can further be seen that the presence of the layers 406 and 410, having a higher relative permittivity than the layer(s) 408, tends to confine the regions of strongest electric field away from the layer(s) 408 and within the passivation layers 404 and 412. As a result, the voltage across the electrodes may be increased further before breakdown of the dielectric layers, and hence the device, occurs when compared to an isolator device that does not include the layers 406 and 410.

The layers of higher relative permittivity shown in FIGS. 3 and 4 are applied to those isolator devices merely as examples, and any suitable isolator device may include one or more layers of higher relative permittivity dielectric material to provide the benefits described herein. One or more layers of dielectric material with a higher relative permittivity, such as the layers 406 and 410 in FIG. 4 and the layers 302 and 304 in FIG. 3, in an isolator device may have additional benefits. For example, depending on materials selected, these layers may also act as a charge injection barrier between the electrodes and the lower relative permittivity dielectric layers, and/or may act as a moisture barrier. Additionally or alternatively, in some embodiments, one or more of the passivation layers may not be present. In such cases, a different layer may be present between the electrode and the region of higher relative permittivity dielectric material, or the region of higher relative permittivity dielectric material may be formed directly on or around the electrode, or the electrode may be formed directly on or within the region of higher relative permittivity dielectric material.

In some embodiments, an entire layer of higher permittivity dielectric material may not be deposited. Instead, select regions may be formed in certain areas of the device. For example, regions of higher permittivity dielectric material may be formed proximate to edges of one or both of the conductive structures, in order to push the peak electric field away from the lower relative permittivity layer(s), and the higher relative permittivity regions may be not present within at least a portion of the layer of lower relative permittivity between the conductive structures.

Some embodiments may use only one layer of higher relative permittivity dielectric material, between the layer(s) of lower permittivity dielectric material and one of the electrodes, which may provide at least some of the benefits provided by two-layer embodiments such as those shown in FIGS. 3 and 4. Other embodiments may additionally or alternatively include additional layers to those described above and shown in FIGS. 3 and 4.

Figure 5:
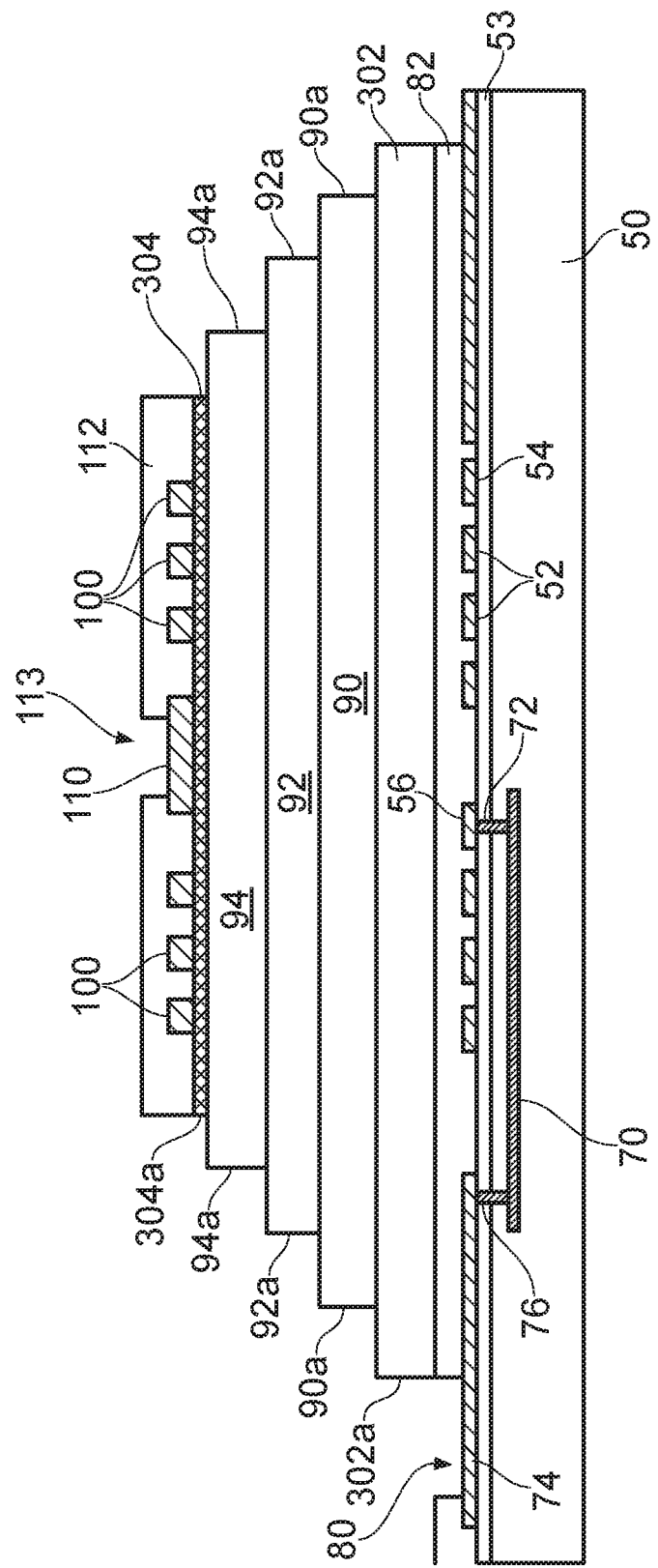
FIG. 5 shows an example of a further embodiment of an isolator device in accordance with the teachings of this disclosure.

In a variation, the shape of the dielectric stack may be varied, as shown in FIG. 5, such that at least one succeeding layer of dielectric does not overlap and fully enclose a preceding layer.

In the arrangement shown in FIG. 5 three layers 90, 92 and 94 of polyimide have been deposited so as to build up a body of dielectric material to a required thickness. One or both sides of the polyimide stack formed by the layers 90, 92 and 94 may be bounded by a higher permittivity dielectric as discussed with respect to FIG. 3.

As shown in FIG. 5 a high permittivity layer of dielectric material 302 is formed over the passivation 82. The layer 302 may, for example be formed of silicon nitride, silicon dioxide or the other materials listed with respect to FIG. 3. Alternatively layer 302 may be omitted.

Next, a layer 90 of polyimide is formed over the region of the first winding of the transformer, and over the layer 302 if it is provided. The layer 90 has an edge (i.e. a periphery) 90a which may align with an edge 302a of the relatively high permittivity dielectric layer 302. Alternatively, and as shown, the edge 90a may be offset to form a step.

A second layer 92 of polyimide is formed over the first layer, and patterned and etched so as to define the size and shape of the second layer. The second layer 92 has a periphery 92a which is offset from the periphery 90a of the preceding layer 90 such that the layer 92 is smaller in area than the layer 90. The dielectric stack of layers of the first type, which in this example is polyimide could be limited to two layers in depth (thereby providing, for example a depth of polyimide of between 20 and 32 microns and hence a breakdown voltage of between 18 kV and 29 kV). In the example shown in FIG. 5 a third layer 94 of the first dielectric, e.g. polyimide, is formed over the second layer 92. The third layer 94 has a periphery 94a which is offset from the periphery 92a such that the layer 94 is spatially less extensive than the layer 92. Thus the structure can be regarded as forming a few layers from a stepped pyramid (although the structure could be elongate as a plurality of transformers may be formed over a shared dielectric stack).

Once the required depth of the first dielectric has been built up, the structure is topped with a layer 304 of relatively higher permittivity dielectric, e.g. a dielectric of the second type, such as silicon nitride or silicon dioxide. The layer 304 has a periphery 304a which in the finished device may align with the periphery 94a of the preceding dielectric layer 94 or may be offset from the periphery 94a such that the layer 304 is less spatially extensive (smaller) than the layer 94.

The uppermost coil 100 can then be formed as discussed earlier with respect to FIG. 3. The coil 100 may be subsequently enclosed within a further layer of insulator. Polyimide is a suitable choice as it is relatively easy to work with, This design reduces the area of the uppermost dielectric layer 304 compared to the design discussed with respect to FIG. 3. This alternative design seeks to minimize the stress or forces acting on the layer 304 so as to avoid or reduce the incidence of defects or cracks within the layer 304. This can be advantageous as any defect will become a point of increased E-field strength and hence may cause the completed device to break down at voltages lower than these which it could otherwise withstand.

The pyramid like structure also allows stresses within the layers 90, 92 etc. to be redistributed in such a way that the stress as a result of processing the chip, for example due to thermal cycles, is reduced as a function of increasing distance from the substrate. Additionally it is postulated—but as yet unproven so the inventors do not wish to be bound by this statement—that the pyramid structure is better suited to dealing with outgoing from the polyimide layers than the more conventional structure where each layer encloses the preceding layer.

Figure 6:
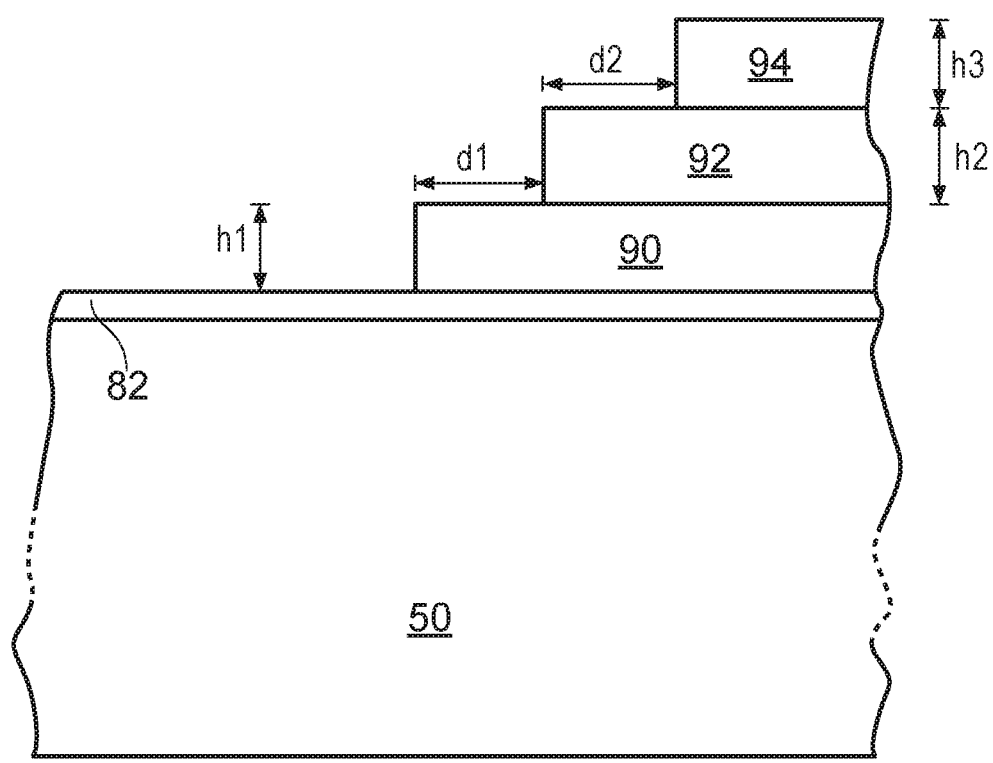
FIG. 6 shows an edge portion of the dielectric stack of the device shown in FIG. 5 in greater detail.

FIG. 6 shows an edge region of the dielectric stack in greater detail. In FIG. 6 the layer 302 was not deposited, and hence the first polyimide layer 90 is deposited in direct contact with the layer 82. The cross-section in FIG. 6 is in a direction orthogonal to the plane of the cross-section in FIG. 5, and as such the metal portions 74 and 53 do not extend to the edge of the first polyimide layer 90. The first polyimide layer 90 is deposited to a depth h1. The second polyimide layer is deposited to a depth h2 and its periphery is stepped inwardly by a distance d1. The third polyimide layer 94, if provided, is deposited to a depth h3 and its periphery is stepped back by a distance d2.

In this embodiment h1, h2 and h3 are between 10 and 20 microns, and d1 and d2 are greater than 0 microns, and preferably in the range of 5 to 30 microns. For example d1 may be the same as h1± a margin of say 10%, 20%, 30% or 50%. The values of d1, d2 and d3 may differ from each other, as may the values of h1, h2 and h3.

Figure 7:
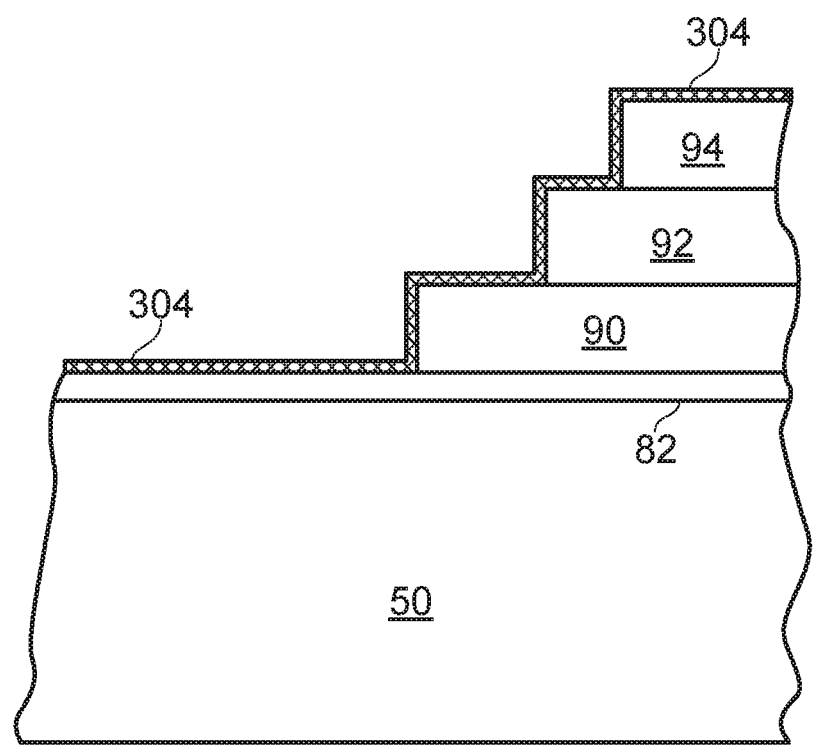
FIG. 7 shows the edge of the dielectric stack during manufacture following chemical vapor phase deposition of a layer of the second dielectric.

During manufacture the second dielectric 304 may be deposited over the stack of the first dielectric by chemical vapor phase deposition. Consequently, the layer 304 initially covers the entire upper surface of the device as shown in FIG. 7, and is then etched back by patterning and selective etching. This allows the spatial extent of this layer to be relatively easily defined. Thus the device shown in FIG. 5 can be fabricated.

The ease with which layer 304 can be patterned and etched gives rise to the possibility of further modifying the shape of the layer 304 to provide for further stress relief.

The areas of highest E-field concentration occur at the edges of the metal tracks forming the windings—as is well known because the edge represents a radius of curvature and E-fields increase with decreasing radius of curvature. The tracks forming the coil can be quite spatially extensive, and a gap exists between adjacent turns of the coil. From this it follows that stress in the layer 304 should be avoided near the edges of each "winding". This can be achieved by forming stress relief structures in the layer 304.

Figure 8:
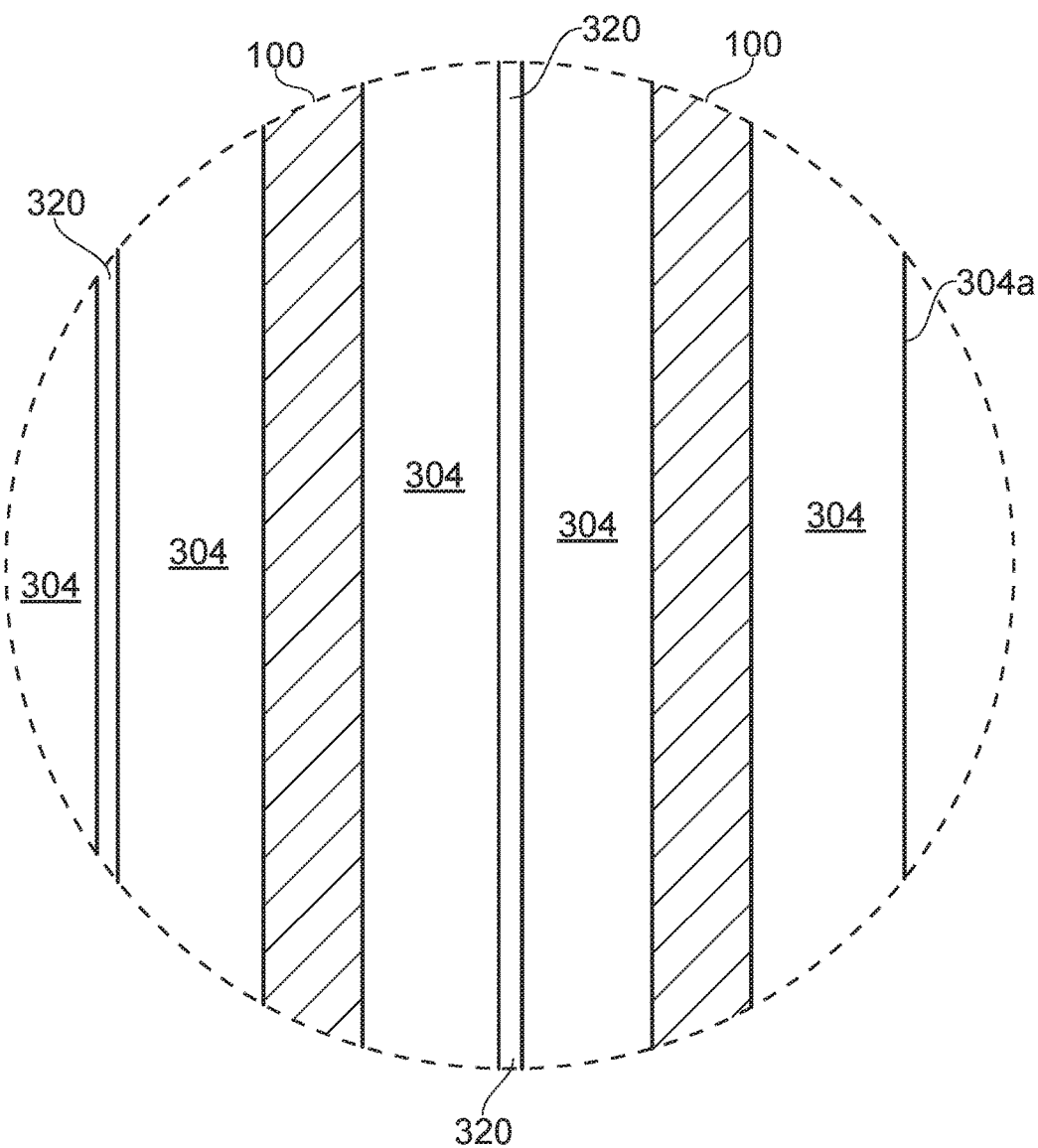
FIG. 8 is a plan view of stress relief structures formed in the layer of the second dielectric.

FIG. 8 is a plan view of a portion of the coil formed by the metal tracks 100. The tracks 100 are formed over the layer 304 of the second dielectric. However to prevent stress build up at the edges of the tracks, stress relief can further be provided by forming channels 320 in the layer 304. Although the channels 320 can be regarded as discontinuities in the layer 306, and hence E-fields would exploit this to break the device down, the channels are formed away from the individual conductors and at a sufficient distance not to present a breakdown risk. Furthermore as each portion of the winding is at a similar voltage, then the channels 320 are formed at a point of substantial E-field cancellation from the adjacent conductors 100. If the channels 100 extend through the entire depth of the layer 304, then the channels also provide a path for outgassing to occur as well as providing stress relief to the regions of the layer 304 associated with the metal tracks.

The formation of such relief channels can be used in conjunction with the arrangements shown in FIGS. 5 and 6, and also that shown in FIG. 3.

It is intended that the foregoing description is intended to illustrate and not to limit the scope of this disclosure and the scope of protection, which is defined by the appended claims. Other embodiments are within the scope of the claims. The aspects and embodiments described herein may be combined in any combination of two or more unless such aspects and/or embodiments are described as mutually exclusive.

Also, it is to be understood that any claim presented herein may depend on any preceding claim of the same type unless that is clearly infeasible.

The invention claimed is:

1. An isolator comprising:
   a first layer of a first dielectric material formed adjacent a substrate;
   a second layer of the first dielectric material formed on the first layer, wherein the second layer is delimited by a periphery and at least some parts of the second layer do not extend to or beyond a periphery of the first layer;
   a layer of a second dielectric material formed over an uppermost one of the first and second layers of the first dielectric material, wherein the layer of the second dielectric material has a higher permittivity than the first dielectric material.

2. The isolator of claim 1, in which a spatial extent of the second layer is contained within a spatial extent of the first layer.

3. The isolator of claim 2, in which the spatial extent of the second layer is less than the spatial extent of the first layer.

4. The isolator of claim 1, further including a third layer of the first dielectric material, and where a spatial extent of the third layer is contained within a spatial extent of the second layer and is less than the spatial extent of the second layer.

5. The isolator of claim 1, in which at least one of the following apply: a) the layer of second dielectric material includes stress relief structures formed therein; and/or b) a spatial extent of the layer of the second dielectric material is less than or equal to a spatial extent of a contiguous portion of the first dielectric material.

6. The isolator of claim 1, in which the layer of the second dielectric includes one or more slots formed therein and intermediate conductive structures formed over the layer of the second dielectric.

7. The isolator of claim 1, in which a first conductor of the isolator is formed beneath the first layer of the first dielectric material and a second conductor of the isolator is formed above an uppermost layer of the first dielectric material.

8. The isolator of claim 7, in which the isolator comprises a transformer having primary and secondary windings, and the first layer, the second layer, and the layer of the second dielectric material are disposed between the primary and secondary windings.

9. The isolator of claim 1, wherein said first dielectric material is polyimide, and/or said second dielectric material is one of silicon nitride, silicon dioxide, sapphire, tantalum pentoxide, strontium titanate, bismuth ferrite and barium strontium titinate.

10. An isolator device comprising:
    first and second conductors;
    a layer of first dielectric material between the first and second conductors; and
    at least one region of second dielectric material between the layer of first dielectric material and at least the second conductor;
    wherein the second dielectric material has a higher relative permittivity than the first dielectric material and wherein one of the layer of the first dielectric and the region of second dielectric material includes a stress relief structure.

11. The device of claim 10, wherein the at least one region of second dielectric material is located proximate an edge of the second conductor, and extends beyond the edge by a guard distance.

12. The device of claim 10, further comprising a further layer between said at least one region of second dielectric material and said at least one of the first and second conductors.

13. The device of claim 12, wherein said further layer is a passivation layer.

14. The device of claim 10, wherein each of said first and second conductors comprises a plate or a coil.

15. The device of claim 10, wherein a thickness of said layer of first dielectric material is between around 10 μm and around 80 μm.

16. The device of claim 10, wherein a thickness of said at least one region of second dielectric material is around 1 μm.

17. The device of claim 10 wherein said at least one region of second dielectric material substantially surrounds said layer of first dielectric material.

18. An electronic device including an isolator device as claimed in claim 10.

* * * * *